(12) United States Patent
Narikiyo et al.

(10) Patent No.: US 7,178,225 B2
(45) Date of Patent: Feb. 20, 2007

(54) COMPONENT PRESSING DEVICE (75) Inventors: Yasuhiro Narikiyo, Fukuoka (JP); Hitoshi Mukohjima, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/428,699

(22) Filed: Jul. 5, 2006

(65) Prior Publication Data

US 2007/0006448 A1    Jan. 11, 2007

(30) Foreign Application Priority Data

Jul. 6, 2005   (JP)   ............................ P2005-197189
Jul. 6, 2005   (JP)   ............................ P2005-197190

(51) Int. Cl.
  *H05K 13/04*   (2006.01)
(52) U.S. Cl. ............................ 29/739; 29/740; 29/741; 29/743; 310/12
(58) Field of Classification Search .................. 29/739, 29/740, 741, 742, 743, 744; 310/12; 901/38, 901/40
See application file for complete search history.

(56) References Cited

U.S. PATENT DOCUMENTS 6,748,649 B2 *  6/2004  Okuda et al. .................. 29/740

FOREIGN PATENT DOCUMENTS

| JP | 2003-319632 | 11/2003 |
| JP | 2003-319633 | 11/2003 |
| JP | 2003319632 A * | 11/2003 |
| JP | 2003319633 A * | 11/2003 |

* cited by examiner

*Primary Examiner*—Peter Vo
*Assistant Examiner*—Livius R Cazan
(74) *Attorney, Agent, or Firm*—Pearne & Gordon LLP (57) ABSTRACT

In a component pressing head which holds a component with a component holding tool provided at one end of a shaft member, rotates the component around an axis of the shaft member and presses the component in an axial direction of the axis, a first voice coil motor and a second voice coil motor are disposed between a upper plate and a lower plate so as to sandwich the shaft member from opposite sides thereof, so that a load is transmitted to the shaft member from the lower plate that is coupled to movable magnet holding portions of these two voice coil motors.

11 Claims, 8 Drawing Sheets

COMPONENT PRESSING DEVICE

BACKGROUND OF THE INVENTION

1. Field of the Invention

This invention relates to a component pressing device which presses a component to a substrate using a voice coil motor.

2. Related Art

A component mounting apparatus for mount an electronic component to a substrate by pressing is provided with a load generating means for generating pressing load to press the electronic component to the substrate. There is known one conventional load generating means constituted by using a voice coil motor that is provided with a combination of coils and magnets. In this construction, a thrust force, which is generated by energizing the coils in magnet fields provided by the magnets, is transmitted to the electric component through an electronic component holding tool (see, for example, JP-A-2003-319632). In JP-A-2003-319632, two magnets having different directions of magnetization are arranged in series along a thrust generation direction, and two of inner and outer layers of coils are provided to sandwich the magnets, so that high thrust force is obtained.

In recent years, accompanying with diversification in variety of electronic components, there have been required component pressing devices which can apply high mounting loads, for mounting large-size chips such as CCD and CMOS components etc. One option to realize mounting operations with the high mounting load would be to increase the thrust force of the voice coil motor itself. However, for this option, it is necessary to provide magnets larger than the magnets conventionally used. However, such the large magnets have problems in availability in the market, and it is difficult to obtain large magnets that satisfy required specifications under reasonable costs and desired delivery deadlines. Further, it is not avoidable that the size and weight of the voice coil motor are increased as a result of obtaining high thrust force. That is against demands to make the mounting, apparatuses compact. As discussed above, there have been problems in the conventional component mounting apparatus in adapting high mounting loads due to limitation of the thrust force of the voice coil motor.

SUMMARY OF THE INVENTION

The present invention has been made in view of the above circumstances, and an object of the invention is to provide a component pressing device which can apply high mounting loads using small and light voice coil motors.

The invention provides a component pressing device which holds a component with a component holding tool provided at one end of a shaft member, rotates the component around an axis of the shaft member and presses the component in an axial direction of the axis, so that the component is pressed against a substrate, comprising:

a first voice coil motor for generating a thrust force in the axial direction including a first coil and a first magnet movable with respect to the first coil;

a second voice coil motor for generating a thrust force in the axial direction including a second coil and a second magnet movable with respect to the second coil;

a first coupling member coupling the first coil and the second coil to each other;

a second coupling member coupling the first magnet and the second magnet to each other;

a rotational holding portion provided between the first voice coil motor and the second voice coil motor for holding the shaft member rotationally with respect to the second coupling member;

a rotation-drive mechanism fixed to the first coupling member for driving the shaft member and allowing a relative displacement of the shaft member in the axial direction with respect to the first coupling member; and a guiding device for guiding the second coupling member in the axial direction with respect to the first coupling member while restricting rotation of the second coupling member around the axis with respect to the first coupling member.

According to the invention, the first voice coil motor and the second voice coil motor are arranged on opposite sides so as to sandwich the shaft member provided with the component holding tool at the one end thereof, and the load is transmitted to the shaft member from the coupling members that are coupled to movable magnet holding portions of these two voice coil motors. Accordingly, it is possible to provide a high mounting load using small and light voice coil motors.

DETAILED DESCRIPTION OF THE PREFERRED EMBODIMENTS

Preferred embodiments of the present invention will now be described in detail with reference to the drawings.

Embodiment 1

Figure 1:
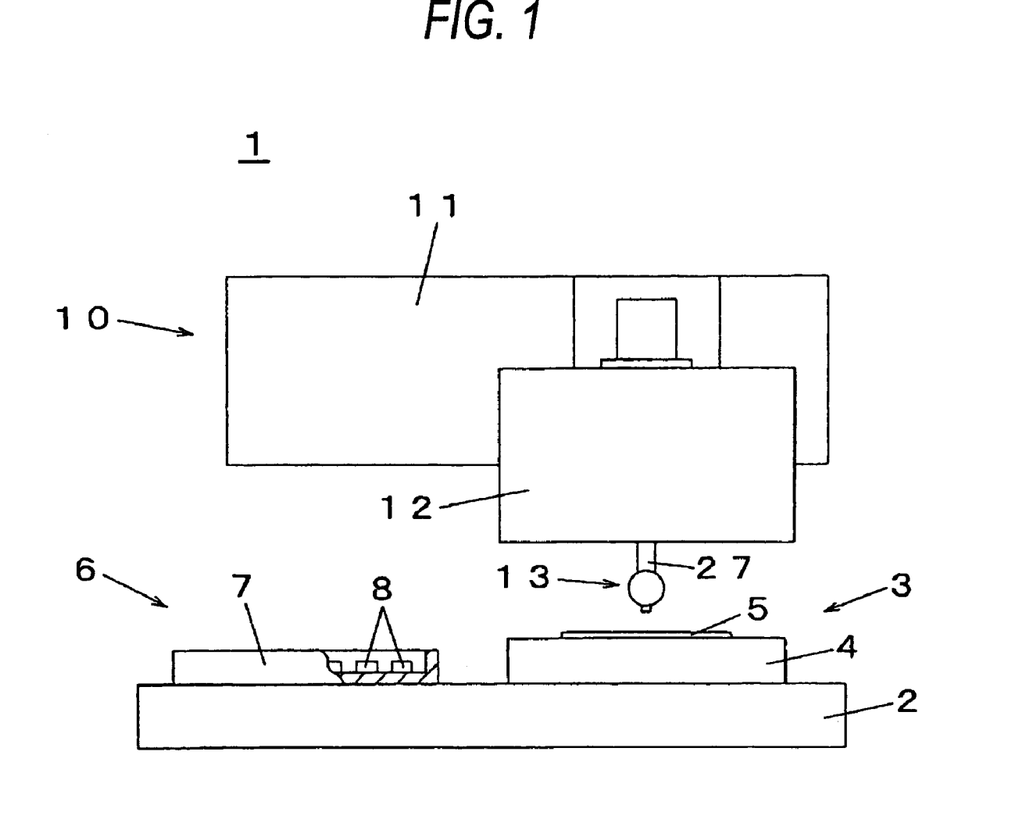
FIG. 1 shows a front view of a component mounting apparatus according to Embodiment 1 of the present invention.
Figure 2:
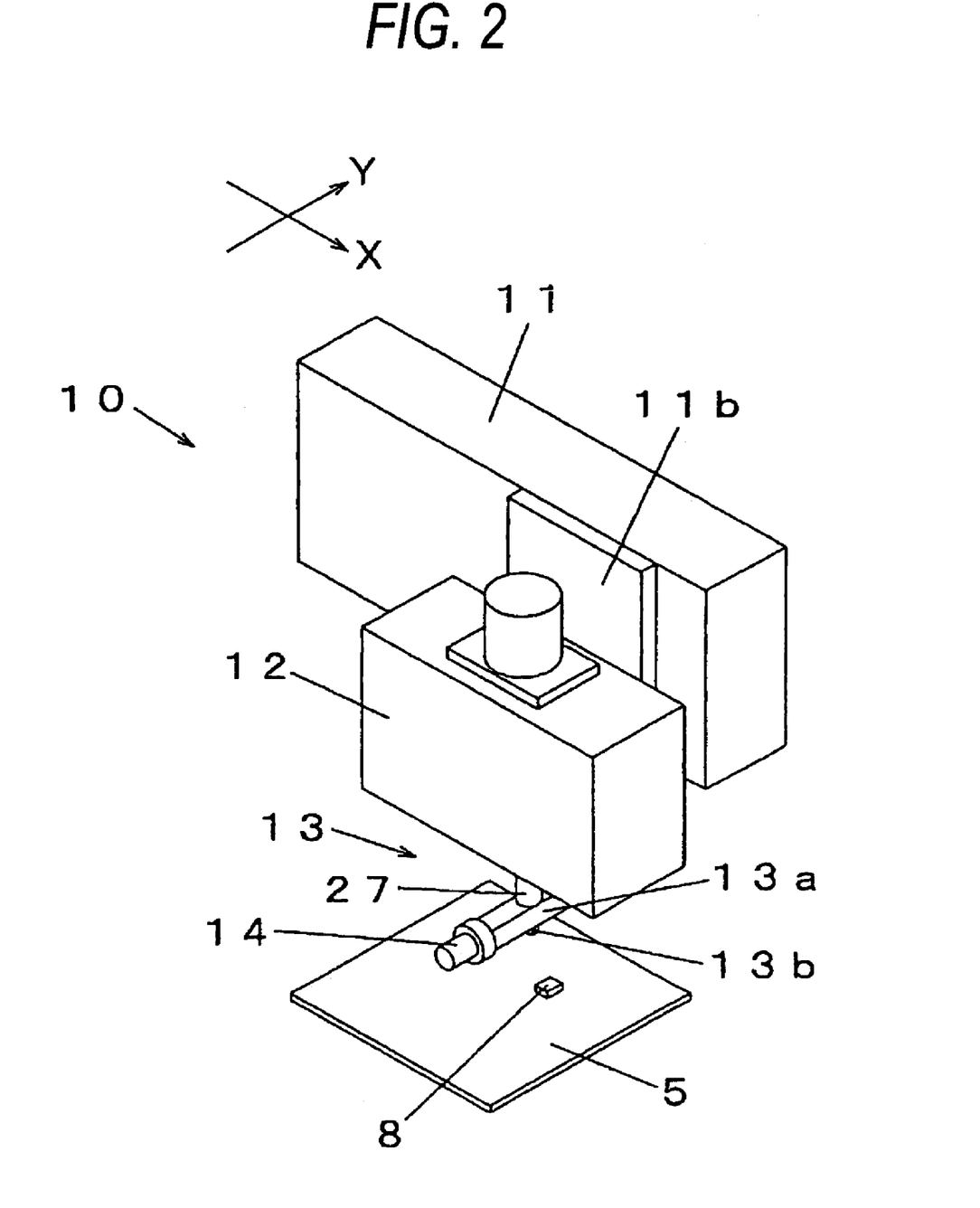
FIG. 2 shows a perspective view of the component mounting apparatus according to Embodiment 1 of the present invention.

FIG. 1 shows a front view of a component mounting apparatus according to Embodiment 1 of the present invention. FIG. 2 shows a perspective view of the component mounting apparatus according to Embodiment 1 of the present invention. FIGS. 3, 4 5A and 5B show structural explanatory views of a component pressing head in the component mounting apparatus according to Embodiment 1 of the present invention.

First, referring to FIGS. 1 and 2, the construction of the component mounting apparatus will be described. In FIG. 1, the component mounting apparatus 1 includes a substrate holding portion 3, a component feeding portion 6 and a mounting portion 10 which are disposed on base 2. The substrate holding portion 3 includes a holding stage 4, and a substrate 5 as an object on which electronic components are mounted is held on the holding stage 4. Electronic components 8 (or, referred to simply "components") are stored in a component tray 7 which is placed on the component feeding portion 6.

As shown in FIG. 2, the mounting portion 10 is constructed by disposing a component pressing head 12 movably in X direction with a moving table 11. The component mounting head 12 includes a shaft member 27 projecting downward, on a lower end part of the shaft member 27, a bonding tool 13 is attached. The bonding tool 13 includes a horn 13a extending horizontally, and a bonding operation portion 13b is protruded from a lower face of the horn 13a. The bonding operation portion 13b is configured to suck one of the electronic components 8 by contacting with an upper face of it, and to mount the electronic component 8 on the substrate 5 by pressing the electronic component 8 to the substrate 5. The bonding tool 13 is employed as a component holding tool to hold the electronic component 8.

A vibrator 14 is attached to one end of the horn 13a. By driving the vibrator 14, ultra-sonic vibration is transmitted to the bonding operation portion 13b through the horn 13a. By this construction, the ultra-sonic vibration is supplied to the electronic component 8 through the bonding operation portion 13b, when the electronic component 8 is pressed to the substrate 5 by the bonding tool 13.

Next, referring to FIG. 3, the structure of the component pressing head 12 will be described. The component pressing head 12 constitutes a component pressing device to hold the electronic component 8, to rotate the electronic component 8 around an axis 27b of the shaft member 27, and to press the component 8 to the substrate 5 so as to be mounted by the bonding tool 13 as the component holding tool provided at one end of the shaft member 27.

Figure 3:
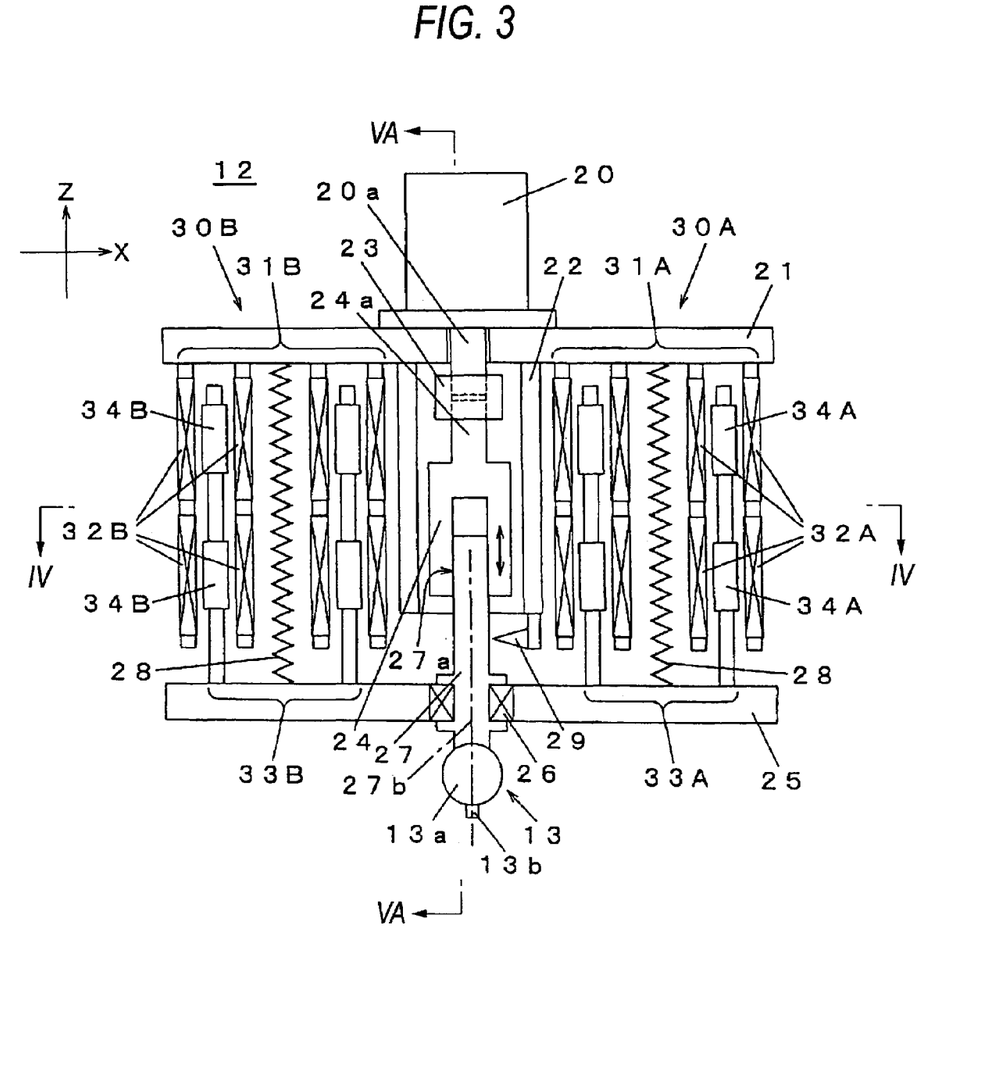
FIG. 3 shows a structural explanatory view of a component pressing head in the component mounting apparatus according to Embodiment 1 of the present invention.

In FIG. 3, an actuation driving motor 20 is disposed at a central position on an upper face of a rectangular upper plate 21 extending horizontally, so that a rotary shaft 20a is projected downward. The rotary shaft 20a is connected with a shaft portion 24a of a spline nut 24 through a coupling 23. Outer peripheries of the coupling 23 and the spline nut 24 are surrounded by a cylindrical bracket 22, which is provided on a lower face of the upper plate 21 so as to project downward. By driving the actuation driving motor 20, the spline nut 24 rotates.

Below the upper plate 21, a rectangular lower plate 25 extending horizontally is provided so as to be in parallel with the upper plate 21. The bracket 22 is provided so as to surround the rotary shaft 20a. A bearing 26 is disposed at a central position in the lower plate 25. The bearing 26 holds the shaft member 27 so as to be rotatable but not to be displaced in the vertical direction. The low end of the shaft member 27, the bonding tool 13 is coupled through a tool holder (not-shown).

A spline groove portion 27a is provided in an upper portion of the shaft member 27, and the spline groove portion 27a is fitted with the spline nut 24. In this state, the shaft member 27 is allowed to move vertically, and the rotation is transmitted from the spline nut 24 to the shaft member 27. Accordingly, by driving the actuation driving motor 20 to rotate the spline nut 24, the bonding tool 13 rotates around the axis 27b of the shaft member 27.

The lower plate 25 is held by tensile springs 28 located at two positions on left and right sides. The total weight of the lower plate 25 combined with the bearing 26, the shaft member 27 and the bonding tool 13 is sustained by the tensile springs 28. A level detection portion 29 is hung from a lower end of the bracket 22 along the shaft member 27, so that a relative portion of the lower plate 25 with respect to the upper plate 21, namely, a vertical position of the bonding tool 13, can be detected by the level detection portion 29.

Between the upper plate 21 and the lower plate 25, a first voice coil motor 30A and a second voice coil motor 30B are disposed interposing the shaft member 27 in X direction. Each of the first voice coil motor 30A and the second voice coil motor 30B is constituted by two magnets divided in the vertical direction which are sandwiched by coils constituting two of inner and outer layers (see JP-A-2003-319632 for example). Although the description will be made only to the first voice coil motor 30A below, the second voice coil motor 30B has the same structure as the first voice coil motor 30A.

A first yoke member 31A is fixed on the lower face of the upper plate 21 so as to be located on a side of the bracket 22. The first yoke member 31A is a double-cylinder member made of a magnetic metal. The tensile spring 28 is disposed to penetrate the inner cylinder of this double-cylinder structure vertically. Two rows of first coils 32A are arrayed in the vertical direction on the first yoke member 31A, so that the first coils 32A are fixed to the upper plate 21.

A cylindrical first movable magnet holding portion 33A is provided on the upper face of the lower plate 25 so as to project upward on an outer side of the bearing 26. Two rows of first magnets 34A are arrayed in the vertical direction on the first movable magnet holding portion 33A. Each first magnet 34A is located between two of the first coils 32A that are provided on the inner cylinder and the outer cylinder of the first yoke member 31A, respectively. By moving the lower plate 25 with respect to the upper plate 21, the first magnets 34A are configured to be movable with respect to the first coils 32A in the vertical direction, namely in the direction of the axis 27b.

The first coils 32A are provided on the magnetic circuit constituted with the first magnets 34A. By supplying driving current to the first coils 32A, forces are subjected to the first coils 32A and the first magnets 34A along the axis 27b of the shaft member 27 respectively, with magnitudes according to the magnitude of the current, in a direction according to the direction of the current. These forces are transmitted to the lower pate 25 as a thrust force generated by the first voice coil motor 30A.

The second voice coil motor 30B includes second coils 32B and second magnets 34B (to which the letter "A" is replaced with "B" in the reference numerals of the first coils 32A and the first magnet 34A). A thrust force generated by the second voice coil motor 30B is also transmitted to the lower plate 25, namely a combined force of these two thrust forces is transmitted to the shaft member 27, and further transmitted to the bonding tool 13 attached to the lower end of the shaft member 27. By this construction, the bonding tool 13 presses the component 8 to the substrate 5 with the bonding operation portion 13b.

In the above construction, the voice coil motor 30A is constituted by the first coils 32A and the first magnets 34A movable with respect to the first coil 32A and provides a thrust force of the axis 27b of the shaft member 27. Similarly, the second voice coil motor 30B is constituted by the second coils 32B and the second magnets 34B movable with respect to the second coil 32B and provides a thrust force of the axis 27b of the shaft member 27.

The upper plate 21 is employed as a first coupling member coupling the first coils 32A and the second coils 32B, and the lower plate 25 is employed as a second coupling member coupling the first magnets 34A and the second magnets 34B. Further, the actuation driving motor 20, the coupling 23 and the spline nut 24 constitute together a rotation-drive mechanism fixed to the upper plate 21 to rotate the shaft member 27 while allowing a relative displacement of the shaft member 27 in the direction of axis 27b with respect to the upper plate 21. Furthermore, the bearing 26 is employed as a rotational holding portion provided between the first voice coil motor 30A and the second voice coil motor 30B for holding the shaft member 27 rotationally with respect to the lower plate 25.

Figure 4:
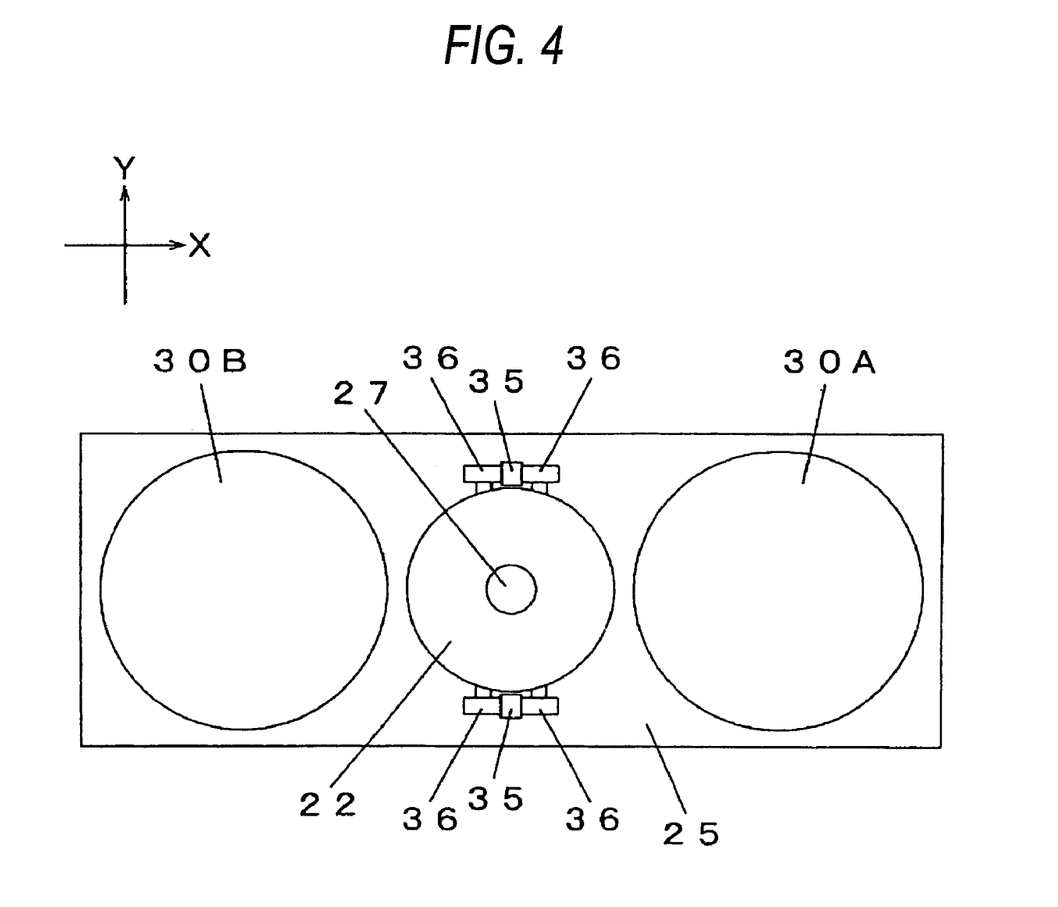
FIG. 4 shows a structural explanatory view of the component pressing head in the component mounting apparatus according to Embodiment 1 of the present invention.
Figures 5A, 5B:
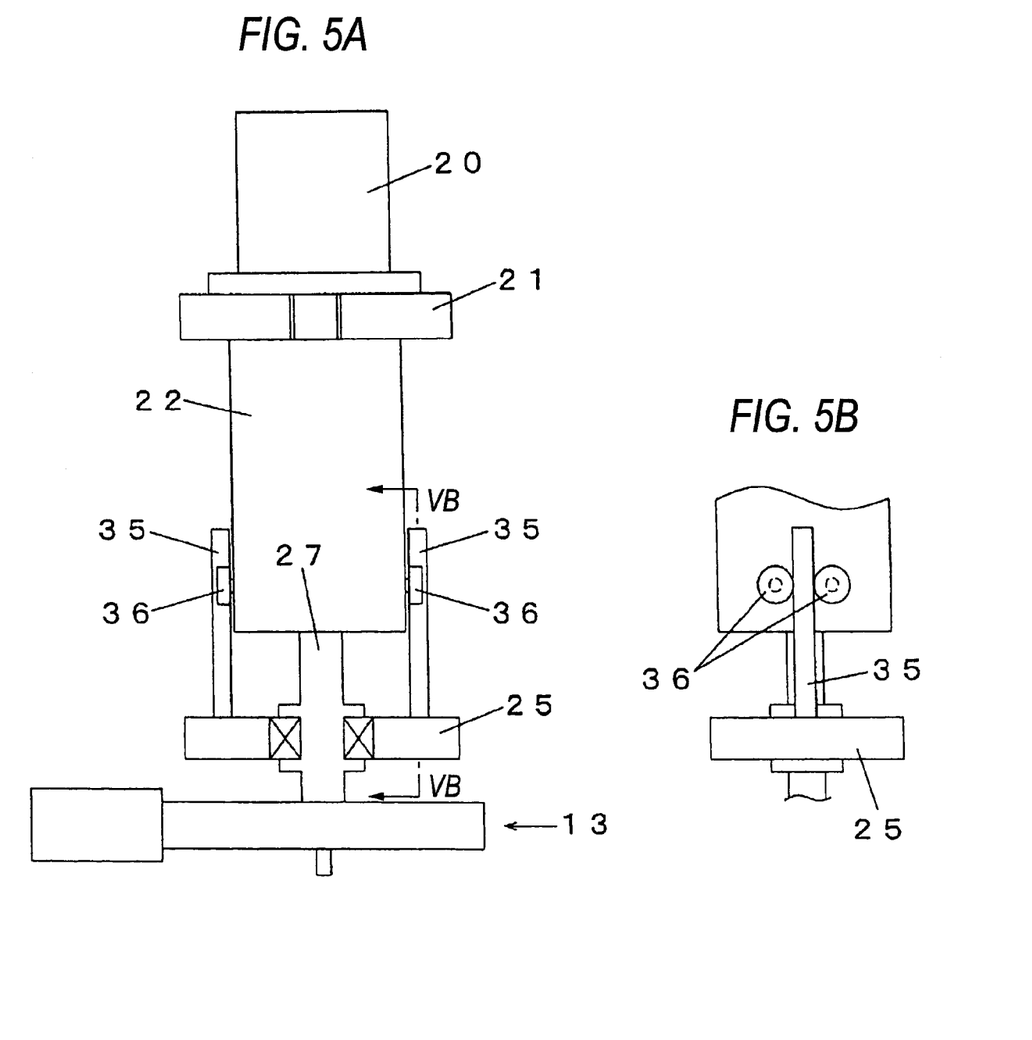
FIGS. 5A and 5B show structural explanatory views of the component pressing head in the component mounting apparatus according to Embodiment 1 of the present invention.

Next, referring to FIGS. 4, 5A and 5B, a guiding mechanism to guide a vertical movement of the lower plate 25 will be described. The guiding mechanism has a function to guide a movement of the lower plate 25 while preventing the rotation of the lower plate 25 with respect to the upper plate 21. FIG. 4 shows a sectional view taken along the line IV—IV in FIG. 3. FIG. 5A shows a sectional view taken along the line VA—VA in FIG. 3. FIG. 5B shows a sectional view taken along the line VB—VB in FIG. 5A.

As shown in FIGS. 4, 5A and 5B, two guide members 35 stand vertically on the upper face of the lower plate 25 with a symmetric arrangement along Y direction, interposing the bracket 22. A pair of guide rollers 36 are provided on an outer periphery of the bracket so as to clamp both sliding-contact face provided both sides in X direction of the guide member 35.

The guide rollers 36 are capable of rolling on the sliding-contact faces of the guide member 35, so that the lower plate 25 is guided along the vertical direction at the symmetric positions with respect to the axis 27b when the lower plate 25 is moved with respect to the upper plate 21. At this point, as the lower plate 25 is guided in such a state that the guide rollers 36 as roller members clamp the sliding-contact faces of the guide member 35 as a sliding-contact member from both sides, the lower plate is restricted from rotating around the axis 27b in XY plane.

In other words, the guide member 35 and the guide rollers 36 are provided at plural positions in a symmetric arrangement with respect to the axis 27b go as to constitute a guiding device to guide the lower plate 25 in the direction of the axis 27b with respect to the upper plate 21 while restricting rotation of the lower plate 25 around the axis 27b with respect to the upper plate 21.

As described above, in the component pressing head 12 of this embodiment, two voice coil motors are disposed on opposite sides so as to interpose the shaft member 27 to which the bonding tool 13 is attached. The construction is made by transmitting a thrust force to the shaft member 27 from the second coupling member 25 coupled to the movable magnet holding portions of these two voice coil motors. By this construction, it is possible to provide a component pressing device which can apply high mounting loads using small and light voice coil motors.

Embodiment 2

Figure 6:
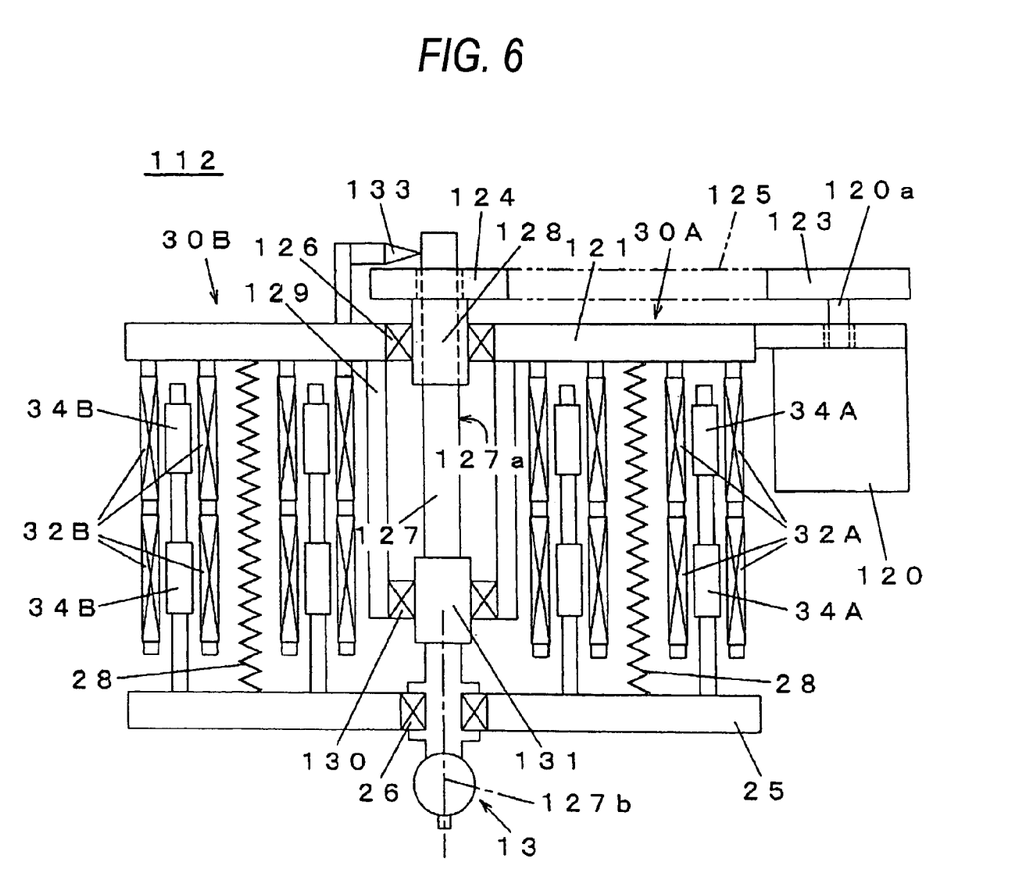
FIG. 6 shows a structural explanatory view of a component pressing head in the component mounting apparatus according to Embodiment 2 of the present invention.

FIG. 6 shows a component pressing head according to Embodiment 2 of the invention. The component pressing head 112 described in Embodiment 2 is configured that the actuation driving motor, which is disposed on the upper face of the upper plate 21 so that the rotary shaft projects downward in the component pressing head 12 of Embodiment 1, is disposed on a side of the upper plate 21 so that the rotary shaft projects upward. By making the construction in such a manner, the motor does not project upward, so that height of the component pressing head can be reduced and it is possible to provide a compact component pressing device.

In FIG. 6, the component pressing head 112 has a structure that the first voice coil motor 30A and the second voice coil motor 30B similar to Embodiment 1 are disposed, interposing the shaft member 27, between the lower plate 25 and an upper plate 121 of this embodiment. The first voice coil motor 30A and the second voice coil motor 30B generates thrust forces in a direction of an axis 127b of a shaft member 127, these thrust forces are transmitted to the shaft member 127 through the lower plate 25.

Similarly to Embodiment 1, the lower plate 25 is sustained by the upper plate 121 through the tensile springs 28. The upper plate 121 is a horizontal plate member with a shape similar to the upper plate 21 of Embodiment 1. On side end of the upper plate 121, an actuation driving motor 120 is disposed so that a rotary shaft 120a projects upward, and a pulley 123 is attached to the rotary shaft 120a. Further, a spline nut 128 is rotatably held through a bearing 126 at a central portion of the upper plate 121, and a pulley 124 is attached to the spline nut 128. The pulley 123 and the pulley 124 are linked with a belt 125, so that a rotation is transmitted to the spline nut 128 through the pulley 123, the pulley 124 and the belt 125, when the actuation driving motor 120 is driven. Incidentally, the transmitting mechanism of the rotation from the actuation driving motor 120 to the spline nut 128 is not limited to such pulleys and the belt. For example, gear trains or gears linked by a belt may replace the above mechanism constituted by the pulleys and the belt.

This rotation is transmitted from the spline nut 128 to the shaft member 127 in which a spline groove portion 127a is provided, and further transmitted to the bonding tool 13 by being converted to a movement in the vertical direction. Namely, by transmitting the rotation, the shaft member 127 is movable with respect to the spline nut 128, and thus the lower plate 25 is allowed to relatively move with respect to the upper plate 121. The vertical movement of the shaft member 127 is detected by a level detection portion 133 extended from the upper plate 121.

The shaft member 127 rotatably held by the bearing 26 provided in the lower plate 25 extends above the upper plate 121 while being engaged with the spline nut 128. A tubular bracket 129 is fixed on a lower face of the upper plate 121 so as to surround the shaft member 127. An intermediate portion of the shaft member 127 is rotatably held through a bearing 130 and a spline nut 131 in such a state that relative displacement is allowed.

The component pressing head 112 includes a guiding device similar to that of Embodiment 1 as shown in FIGS. 4, 5A and 5B, so that the vertical movement of the lower plate 25 is guided and the lower plate 25 is restricted from rotating around the axis 127b in XY plane, when the lower plate 25 is moved with respect to the upper plate 121 by driving the actuation driving motor 120.

In the above construction, the upper plate 121 is employed as the first coupling member coupling the first coils 32A and the second coils 32B. The lower plate 25 is employed as the second coupling member coupling the first magnets 34A and the second magnets 34B. Further, the actuation driving motor 120, the pulley 123, the pulley 124, the belt 125 and the spline nut 128 constitute together a rotation-drive mechanism fixed to the upper plate 121 to rotate the shaft member 127 while allowing a relative displacement of the shaft member 127 in the direction of axis 127b with respect to the upper plate 121. Furthermore, the bearing 26 is employed as a rotational holding portion provided between the first voice coil motor 30A and the second voice coil motor 30B for holding the shaft member 127 rotationally with respect to the lower plate 25. By such the construction, the advantages similar to Embodiment 1 are obtained.

Embodiment 3

Figure 7:
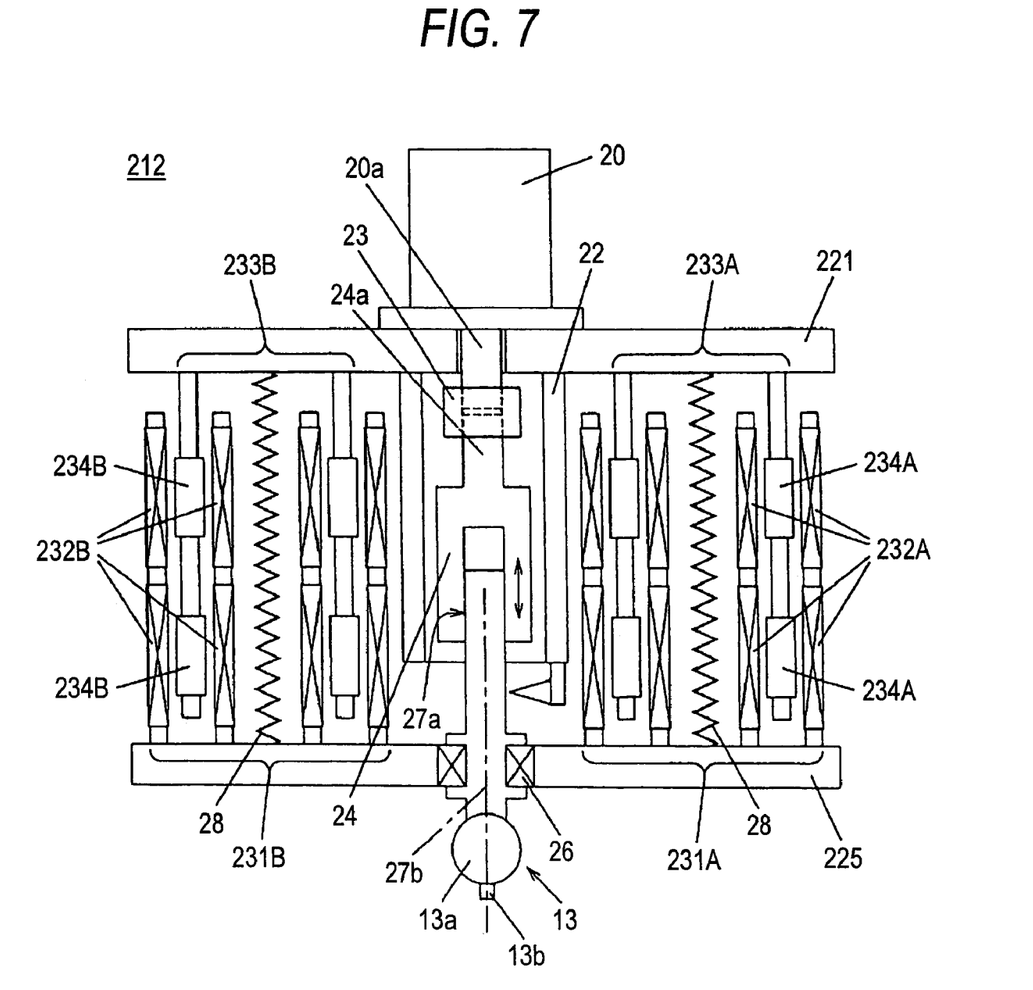
FIG. 7 shows a structural explanatory view of a component pressing head in the component mounting apparatus according to Embodiment 3 of the present invention.

FIG. 7 shows structural explanatory view of a component pressing head 212 in the component mounting apparatus according to Embodiment 3 of the present invention.

Referring to FIG. 7, the structure of the component pressing head 212 will be described. The basic structure of the component pressing head 212 is similar to the component pressing head 12 of Embodiment 1. The same reference numerals are used to describe the parts similar to those in Embodiment 1.

In the component pressing head 212, a first yoke member 231A of a first voice coil motor 230A is fixed on the upper face of the lower plate 225 so as to project upward on an outer side of the bearing 26. The first yoke member 231A is a double-cylinder member made of a magnetic metal. The tensile spring 28 is disposed to penetrate the inner cylinder of this double-cylinder structure vertically. Two rows of first coils 232A are arrayed in the vertical direction on the first yoke member 231A, so that the first coils 232A are fixed to the upper plate 221.

A cylindrical first movable magnet holding portion 233A is provided on the lower face of the upper plate 221 so as to be located on a side of the bracket 22. Two rows of first magnets 234A are arrayed in the vertical direction on the first movable magnet holding portion 233A. Each first magnet 234A is located between two of the first coils 232A that are provided on the inner cylinder and the outer cylinder of the first yoke member 231A, respectively. By moving the lower plate 225 with respect to the upper plate 221, the first magnets 234A are configured to be movable with respect to the first coils 232A in the vertical direction, namely in the direction of the axis 27b.

The first coils 232A are provided on the magnetic circuit constituted with the first magnets 234A. By supplying driving current to the first coils 232A, forces are subjected to the first coils 232A and the first magnets 234A along the axis 27b of the shaft member 27 respectively, with magnitudes according to the magnitude of the current, in a direction according to the direction of the current. These forces are transmitted to the lower pate 225 as a thrust force generated by the first voice coil motor 230A.

A second voice coil motor 230B includes second coils 232B and second magnets 234B (to which the letter "A" is replaced with "B" in the reference numerals of the first coils 232A and the first magnet 234A). A thrust force generated by the second voice coil motor 230B is also transmitted to the lower plate 225, namely a combined force of these two thrust forces is transmitted to the shaft member 27, and further transmitted to the bonding tool 13 attached to the lower end of the shaft member 27. By this construction, the bonding tool 13 presses the component to the substrate with the bonding operation portion 13b.

In the above construction, the first coils 230A is constituted by the first magnets 234A and the first coils 232A movable with respect to the first magnets 234A and provides a thrust force of the axis 27b of the shaft member 27. Similarly, the second voice coil motor 230B is constituted by the second magnets 234B and the second coils 32B movable with respect to the second magnets 234B and provides a thrust force of the axis 27b of the shaft member 27.

The upper plate 221 is employed as a first coupling member coupling the first magnets 234A and the second magnets 234B, and the lower plate 225 is employed as a second coupling member coupling the first coils 232A and the second coils 232B. Further, the actuation driving motor 20, the coupling 23 and the spline nut 24 constitute together a rotation-drive mechanism fixed to the upper plate 221 to rotate the shaft member 27 while allowing a relative displacement of the shaft member 271n the direction of axis 27b with respect to the upper plate 221. Furthermore, the bearing 26 is employed as a rotational holding portion provided between the first voice coil motor 230A and the second voice coil motor 230B for holding the shaft member 27 rotationally with respect to the lower plate 225.

The component pressing head 212 includes a guiding device similar to that of Embodiment 1 as shown in FIGS. 4, 5A and 5B, so that the vertical movement of the lower plate 225 is guided and the lower plate 225 is restricted from rotating around the axis 27b in XY plane, when the lower plate 225 is moved with respect to the upper plate 221 by driving the actuation driving motor 20.

As described above, in the component pressing head 212 of this embodiment, two voice coil motors are disposed on opposite sides so as to interpose the shaft member 27 to which the bonding tool 13 is attached. The construction is made by transmitting a thrust force to the shaft member 27 from the second coupling member 25 coupled to the movable magnet holding portions of these two voice coil motors. By this construction, it is possible to provide a component pressing device which can apply high mounting loads using small and light voice coil motors.

Embodiment 4

Figure 8:
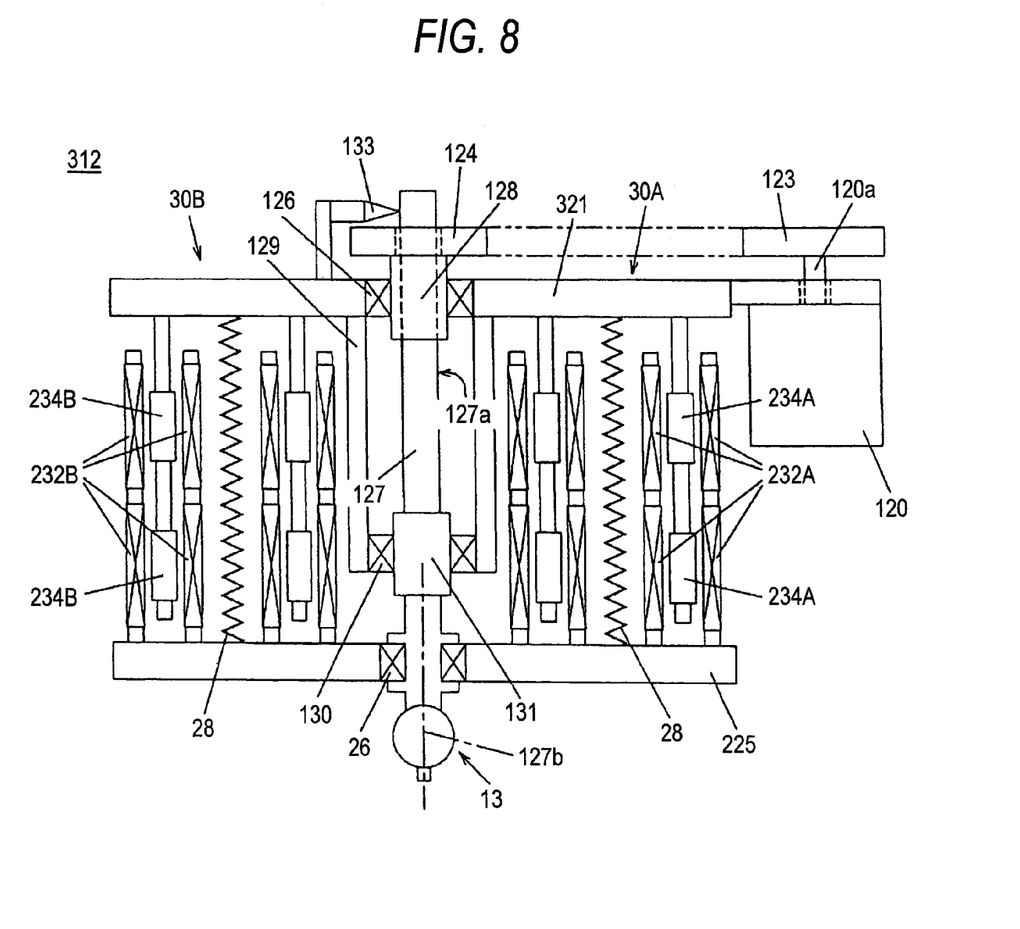
FIG. 8 shows a structural explanatory view of a component pressing head in the component mounting apparatus according to Embodiment 4 of the present invention.

FIG. 8 shows a component pressing head according to Embodiment 4 of the invention. The component pressing head 312 described in Embodiment 4 is configured that the actuation driving motor, which is disposed on the upper face of the upper plate 221 so that the rosary shaft projects downward in the component pressing head 212 of Embodiment 3, is disposed on a side of the upper plate 221 so that the rotary shaft projects upward. By making the construction in such a manner, the motor does not project upward, so that height of the component pressing head can be reduced and it is possible to provide a compact component pressing device.

Similarly to Embodiments 2 and 3, the lower plate 225 is sustained by the upper plate 321 through the tensile springs 28. The upper plate 321 is a horizontal plate member with a shape similar to the upper plate 221 of Embodiment 3. On side end of the upper plate 321, the actuation driving motor 120 is disposed so that the rotary shaft 120a projects upward, and the pulley 123 is attached to the rotary shaft 120a. Further, the spline nut 128 is rotatably held through the bearing 126 at the central portion of the upper plate 121, and the pulley 124 is attached to the spline nut 128. The pulley 123 and the pulley 124 are linked with the belt 125, so that a rotation is transmitted to the spline nut 128 through the pulley 123, the pulley 124 and the belt 125, when the actuation driving motor 120 is driven.

This rotation is transmitted from the spline nut 128 to the shaft member 127 in which a spline groove portion 127a is provided, and further transmitted to the bonding tool 13 by being converted to a movement in the vertical direction. Namely, by transmitting the rotation, the shaft member 127 is movable with respect to the spline nut 128, and thus the lower plate 25 is allowed to relatively move with respect to the upper plate 121. The vertical movement of the shaft member 127 is detected by the level detection portion 133 extended from the upper plate 121.

Incidentally, the component pressing head 312 includes a guiding device similar to that of Embodiment 1 as shown in FIGS. 4, 5A and 5B, so that the vertical movement of the lower plate 225 is guided and the lower plate 225 is restricted from rotating around the axis 127*b* in XY plane, when the lower plate 225 is moved with respect to the upper plate 221 by driving the actuation driving motor 120.

In the above construction, the upper plate 321 is employed as the first coupling member coupling the first magnets 234A and the second magnets 234B. The lower plate 225 is employed as the second coupling member coupling the first coils 232A and the second coils 232B. Further, the actuation driving motor 120, the pulley 123, the pulley 124, the belt 125 and the spline nut 128 constitute together a rotation-drive mechanism fixed to the upper plate 121 to rotate the shaft member 127 while allowing a relative displacement of the shaft member 127 in the direction of axis 127*b* with respect to the upper plate 121. Furthermore, the bearing 26 is employed as a rotational holding portion provided between the first voice coil motor 230A and the second voice coil motor 230B for holding the shaft member 127 rotationally with respect to the lower plate 225. By such the construction, the advantages similar to the above Embodiments are obtained.

The component pressing device of the invention provides an advantage that it can apply high mounting loads using small and light voice coil motors, and is therefore applicable to a component mounting apparatus to mount an electronic component to a substrate by pressing.

What is claimed is:

1. A component pressing device which holds a component with a component holding tool provided at one end of a shaft member, rotates the component around an axis of the shaft member and presses the component in an axial direction of the axis, so that the component is pressed against a substrate, comprising:
    a first voice coil motor for generating a first thrust force in the axial direction including a first coil and a first magnet movable with respect to the first coil;
    a second voice coil motor for generating a second thrust force in the axial direction including a second coil and a second magnet movable with respect to the second coil;
    a first coupling member coupling one pair of the first coil and the second coil or the first magnet and the second magnet to each other;
    a second coupling member coupling the other pair of the first coil and the second coil or the first magnet and the second magnet to each other;
    a rotational holding portion provided between the first voice coil motor and the second voice coil motor for holding the shaft member rotationally with respect to the second coupling member;
    a rotation-drive mechanism fixed to the first coupling member for driving the shaft member and allowing a relative displacement of the shaft member in the axial direction with respect to the first coupling member; and
    a guiding device for guiding the second coupling member in the axial direction with respect to the first coupling member while restricting rotation of the second coupling member around the axis with respect to the first coupling member.

2. The component pressing device according to claim 1, wherein the first coupling member couples the first coil and the second coil to each other, and
    the second coupling member couples the first magnet and the second magnet to each other.

3. The component pressing device according to claim 2, wherein the first coupling member includes an upper plate and a first yoke member and second yoke member fixed on a lower face of the upper plate so as to interpose at least a part of the rotation-drive mechanism therebetween, and
    the first coil and the second coil are mounted on the first yoke member and the second yoke member respectively, so that the first coil and the second coil are fixed to the upper plate.

4. The component pressing device according to claim 2, wherein the second coupling member includes a lower plate and a first movable magnet holding portion and a second movable magnet holding portion projected upward on an upper face of the lower plate between which the rotational holding portion is located, and
    the first magnet and the second magnet are mounted on the first movable magnet holding portion and the second movable magnet holding portion respectively so that the first and second magnets are fixed to the lower plate.

5. The component pressing device according to claim 1, wherein the first coupling member couples the first magnet and the second magnet to each other, and
    the second coupling member couples the first coil and the second coil to each other.

6. The component pressing device according to claim 5, wherein the first coupling member includes an upper plate and a first movable magnet holding portion and a second movable magnet holding portion on a lower face of the upper plate so as to interpose at least a part of the rotation-drive mechanism therebetween, and
    the first magnet and the second magnet are mounted on the first movable magnet holding portion and the second movable magnet holding portion respectively so that the first and second magnets are fixed to the upper plate.

7. The component pressing device according to claim 5, wherein the second coupling member includes a lower plate and, a first yoke member and a second yoke member fixed on an upper face of the lower plate so as to interpose the rotational holding portion therebetween, and
    the first coil and the second coil are mounted on the first yoke member and the second yoke member respectively, so that the first coil and the second coil are fixed to the lower plate.

8. The component pressing device according to claim 1, wherein a plurality of the guiding devices are provided in a symmetric arrangement with respect to the axis.

9. The component pressing device according to claim 1, wherein the guiding device includes a sliding-contact member having sliding-contact surfaces on opposite sides thereof and roller members clamping the sliding-contact surfaces from the opposite sides.

10. The component pressing device according to claim 1, wherein the rotation-drive mechanism includes an actuation driving motor disposed on the first coupling member.

11. The component pressing device according to claim 1, wherein the rotation-drive mechanism includes an actuation driving motor, and
    the actuation driving motor is disposed on a side of the first coupling member such that a rotation of the actuation driving motor is transmitted to the shaft member.

* * * * *